United States Patent [19]

Majumdar et al.

[11] Patent Number: 5,747,876
[45] Date of Patent: May 5, 1998

[54] SEMICONDUCTOR DEVICE AND SEMICONDUCTOR MODULE

[75] Inventors: Gourab Majumdar; Satoshi Mori; Sukehisa Noda; Tooru Iwagami; Yoshio Takagi; Hisashi Kawafuji, all of Tokyo, Japan

[73] Assignee: Mitsubishi Denki Kabushiki Kaisha, Tokyo, Japan

[21] Appl. No.: 680,614

[22] Filed: Jul. 16, 1996

[30] Foreign Application Priority Data

Nov. 30, 1995  [JP]  Japan .................. 7-312559

[51] Int. Cl.⁶ .......................... H01L 23/22; H01L 23/24
[52] U.S. Cl. .................. 257/687; 257/706; 257/713; 257/717; 361/709; 361/716; 361/719
[58] Field of Search ........................... 257/686, 687, 257/706, 717, 707, 722, 712, 713; 361/707, 709, 711, 716, 719, 721

[56] References Cited

U.S. PATENT DOCUMENTS

| | | | |
|---|---|---|---|
| 4,698,662 | 10/1987 | Young et al. | 357/80 |
| 4,916,502 | 4/1990 | Oshima | 357/30 |
| 5,057,906 | 10/1991 | Ishigami | 257/723 |
| 5,198,887 | 3/1993 | Brown | 257/722 |
| 5,457,605 | 10/1995 | Wagner et al. | 257/675 |
| 5,539,253 | 7/1996 | Nagaune | 257/687 |

FOREIGN PATENT DOCUMENTS

| | | |
|---|---|---|
| 5 15449 | 2/1993 | Japan . |
| 7 250485 | 9/1995 | Japan . |

*Primary Examiner*—Tom Thomas
*Assistant Examiner*—David Ostrowski
*Attorney, Agent, or Firm*—Oblon, Spivak, McClelland, Maier & Neustadt, P.C.

[57] ABSTRACT

It is an object to facilitate assembly of an application device. A device (101) is provided with a heat sink (51) to radiate loss heat of an IGBT element (11) as a power semiconductor element to an external radiation fin. External terminals (5 and 6) connected to an external circuit substrate protrude in the direction in which the exposed surface of the heat sink (51) is directed. Accordingly, when assembling an application device by mounting the device (101) on the external circuit substrate together with other circuit elements, it is possible to mount the device (101) and other circuit elements together on the common main surface of the circuit substrate, i.e., on its main surface on the side opposite to the side where the radiation fin is attached. Accordingly, it is possible to collectively apply solder on the common main surface of the circuit substrate and collectively solder the device (101) and the other circuit elements.

20 Claims, 12 Drawing Sheets

SEMICONDUCTOR DEVICE AND SEMICONDUCTOR MODULE

BACKGROUND OF THE INVENTION

1. Field of the Invention

The present invention relates to a semiconductor device having a power semiconductor element and a heat sink, and to a semiconductor module formed of this semiconductor device mounted on a circuit substrate together with other circuit elements, and particularly to improvement for facilitating mounting of the semiconductor device together with the other circuit elements on the circuit substrate.

2. Description of the Background Art

FIG. 12 is a front sectional view showing the inside structure of a conventional semiconductor device as the background of the present invention. In this conventional device 151, as shown in FIG. 12, an insulating substrate body 31 is affixed on the upper main surface of a sheet-like heat sink 51. Furthermore, a conductor foil 32 patterned into a certain configuration is provided on the upper main surface of this insulating substrate body 31.

An IGBT element 11, which is a power semiconductor element with heat generation, is affixed with solder in a certain position on the conductor foil 32. Other portions of the conductor foil 32 and the IGBT element 11 are electrically connected through the bonding wire 13. On the conductor foil 32, elements relating to control of the IGBT element 11, such as a controlling semiconductor element 16, a resistance element 17 and a capacitance element 18, are further affixed in predetermined positions, respectively.

The heat sink 51 is attached to a frame-like electrically insulating case 81 which opens in its top and its bottom. The heat sink 51 engages with the opening formed in the bottom of the case 81. The lower main surface of the heat sink 51, or its main surface on the side opposite to the side where the insulating substrate body 31 is attached, is exposed to the outside of the device.

External terminals 85 and 86 are attached to other predetermined positions in the conductor foil 32. These external terminals 85 and 86 are for electrically connecting the circuit of the device formed of the IGBT element 11 etc. and an external device. These external terminals 85 and 86 protrude to the outside from the upper surface portion of the case 81. That is to say, the external terminals 85 and 86 project in the direction opposite to the direction in which the exposed surface (lower main surface) of the heat sink 51 is directed.

The elements such as the IGBT element 11 are accommodated in the room surrounded by the heat sink 51 and the case 81. This accommodation room is filled with the electrically insulating sealing resin 82 in order to protect the elements, such as the IGBT element 11, the bonding wire 13, etc.

FIG. 13 is a front sectional view of another conventional semiconductor device. As shown in FIG. 13, in this conventional device 152, the IGBT element 11 as a power semiconductor element and the controlling semiconductor element 16 are soldered in a plurality of positions on the sheet-like lead frame 83 made of copper having a certain pattern configuration. The lead frame 83 forms the interconnection pattern corresponding to the conductor foil 32 of the device 151 and also forms the external terminals exposed to the outside.

The plate-like heat sink 52 is also provided in this device 152 in such a way that it faces the main surface of the lead frame 83 on the side opposite to its element mounting surface. The electrically insulating sealing resin 2 seals up the lead frame 83 except the external terminals, the elements mounted thereon, and the heat sink 52.

In this device 152, the external terminals are bent so that their ends protrude in the direction opposite to the direction in which the lower main surface or the exposed surface of the heat sink 52 is directed. That is to say, in the device 152, as in the device 151, the ends of the external terminals protrude in the direction opposite to the direction of the exposed surface of the heat sink 52.

Next, the way of using these conventional devices will be described. FIG. 14 is a front sectional view showing the ordinary usage of the device 151. In this usage, various circuit elements 71, 72, 73 are mounted together with the device 151 on the circuit substrate 91 having certain interconnection pattern (not shown). Here, the device 151 is provided on its main surface on the side opposite to the main surface where the circuit elements 71, 72, 73 are mounted. The radiation fin 95 is fixed to the device 151 to be in contact with the exposed surface of the heat sink 52 of the device 151. The other device 152 is usually used in the same way, too.

As have been described above, when attaching the conventional semiconductor device 151 (or 152) to the circuit substrate 91, the semiconductor devices 151 and 152 in which the ends of the external terminals project in the direction opposite to the direction of the exposed surface of the radiation plates 51, 52 are usually attached on the side opposite to the main surface where other circuit elements 71, 72, 73 are mounted.

Accordingly, to mount the semiconductor device 151 (or 152) to the circuit substrate 91, it was necessary first to fix the circuit elements 71, 72, 73 with solder on one main surface of the circuit substrate 91 and then to fix the semiconductor device 151 (or 152) with solder on its other main surface. That is to say, the soldering process must be performed in two steps, which provides the problem of complicating the process.

To collectively carry out the soldering, it is possible to attach the semiconductor device 151 and the circuit elements 71, 72, 73 on the same main surface, as shown in the front sectional view of FIG. 15. In such usage, however, since a circuit element taller than the semiconductor device 151 (e.g., the circuit element 73) can not be mounted between the circuit substrate 91 and the radiation fin 95, there has been a problem that the circuit substrate 91 must be large. That is to say, the usage of FIG. 15 causes a new problem that leads to large-sized application devices including the circuit substrate 91.

SUMMARY OF THE INVENTION

A first aspect of the present invention is directed to a semiconductor device, comprising: a heat sink like a plate being thermally conductive, and having one main surface and the other main surface; an insulating substrate body like a plate fixed on the one main surface; a conductor foil being electrically conductive, provided on a main surface of the insulating substrate body on the side opposite to the heat sink and patterned; a power semiconductor element fixed on the conductor foil; a case having electrically insulating property and having an opening in its bottom, the heat sink being so fitted in the opening that the other main surface is exposed to an outside; and an external terminal being electrically conductive, and having its one end electrically connected to the conductor foil and the other end protruding to the outside; wherein the other end of the external terminal protrudes in the direction in which the other main surface of the heat sink is directed.

Preferably, according to a second aspect, the opening is selectively formed with a peripheral portion left in the bottom of the case, and the external terminal passes through the peripheral portion so that the one end is located inside of the case and the other end is located outside of the case to be fixed to the case.

Preferably, according to a third aspect, the one end of the external terminal is electrically connected to the conductor foil through an electrically well conducting bonding wire.

Preferably, according to a fourth aspect, the external terminal is so fixed to the case that a connection portion of the one end to the bonding wire and a surface of the conductor foil are located almost in the same plane.

Preferably, according to a fifth aspect, the case is formed of a resin suitable for sealing, said resin sealing up the external terminal.

Preferably, according to a sixth aspect, the semiconductor device further comprises a controlling semiconductor element fixed on the conductor foil for controlling the power semiconductor element.

A seventh aspect of the present invention is directed to a semiconductor module, comprising: a semiconductor device including a power semiconductor element therein, a heat sink with its one main surface exposed in the bottom and an external terminal with its end protruding in a direction in which the one main surface is directed; a circuit element having a pin; and a circuit substrate like a plate having one main surface and the other main surface; wherein the external terminal and the pin are fixed to the circuit substrate so that the semiconductor device and the circuit element are mounted on the circuit substrate, the semiconductor device and the circuit element both being disposed on the one main surface side of the circuit substrate; and the circuit substrate has an opening selectively formed in a portion facing the one main surface of the heat sink.

Preferably, according to an eighth aspect, the semiconductor module further comprises a radiation fin being thermally conductive having a flat surface, and having a base portion like projection capable of being inserted in the opening and selectively formed in the flat surface, the base portion having a flat head, wherein the radiation fin is provided on a side of the other main surface of the circuit substrate, the base portion being inserted in the opening so that the head is in surface contact with the one main surface of the heat sink.

Preferably, according to a ninth aspect, the flat surface is adjacent to and faces in parallel to the other main surface of the circuit substrate.

Preferably, according to a tenth aspect, a periphery of the flat surface and a periphery of the circuit substrate almost overlap each other.

Preferably, according to an eleventh aspect, the radiation fin is fixed to the semiconductor device.

Preferably, according to a twelfth aspect, the radiation fin is coupled to the semiconductor device with a screw.

According to the semiconductor device of the first aspect, since the other end of the external terminal protrudes in the direction in which the other main surface of the heat sink, or its exposed surface, is directed, when assembling an application device by mounting the semiconductor device on a circuit substrate together with other circuit elements, it is possible to mount both the semiconductor device and the other circuit elements on the common main surface of the circuit substrate, i.e., on its main surface on the side opposite to the side where the radiation fin is attached.

Hence, it is possible to collectively apply solder on the common main surface of the circuit substrate and collectively solder the semiconductor device and the other circuit elements. That is to say, assembly of an application device is easy. Furthermore, since it is not necessary to set the circuit substrate larger than the radiation fin to provide a circuit element taller than the semiconductor device on the circuit substrate, the application device can be assembled into a small size.

According to the semiconductor device of the second aspect, since the external terminal is fixed to the case, it is not necessary to solder the external terminal to the conductor foil. Also, the problem in the conventional device that the thermal transformation due to the difference in coefficient of thermal expansion between the insulating substrate body and the heat sink causes stresses to concentrate upon the connection between the external terminal and the conductor foil is solved. Furthermore, the external terminal passes through the peripheral portion forming a part of the bottom of the case to be fixed to the case, so that it is possible to form the external terminal into an almost linear simple shape.

According to the semiconductor device of the third aspect, the external terminal and the conductor foil are electrically connected through the bonding wire, so that the process of electrically connecting the external terminal and the conductor foil is simplified when manufacturing the semiconductor device.

According to the semiconductor device of the fourth aspect, since the external terminal is so attached to the case that the portion connected to the bonding wire on one end of the external terminal is located on the almost same plane as the surface of the conductor foil, connection of the bonding wire can be made easily. That is to say, the manufacturing process of the semiconductor device is further simplified.

According to the semiconductor device of the fifth aspect, the resin forming the case seals the external terminal. Hence, the external terminal can be fixed to the case in the simple process of molding the resin integrally with the external terminal. Furthermore, it is possible to easily enhance preciseness of the mounting position of the external terminal.

According to the semiconductor device of the sixth aspect, since it has a controlling semiconductor element for controlling the power semiconductor element, it is not necessary to externally connect the controlling semiconductor element or a corresponding circuit. That is to say, utility of the semiconductor device is enhanced.

According to the semiconductor module of the seventh aspect, the semiconductor device in which the end of the external terminal protrudes in the direction in which the exposed surface of the heat sink is directed is provided on the one main surface side of the circuit substrate together with the circuit elements. Accordingly, it is possible to collectively apply solder onto the one main surface of the circuit substrate and collectively solder the semiconductor device and the circuit elements. That is to say, assembly of the semiconductor module is easy.

Also, since thermal contact can be made between the external radiation fin and the heat sink through the opening formed in the circuit substrate, the radiation fin can be provided on the other main surface side of the circuit substrate. Hence, it is not necessary to set the circuit substrate larger than the radiation fin in order to provide a circuit element taller than the semiconductor device on the circuit substrate, so that the semiconductor module can be small-sized.

According to the semiconductor module of the eighth aspect, since it has a radiation fin, it is not necessary to separately attach an external radiation fin. That is, utility of the semiconductor module is high. Furthermore, this radiation fin is provided on the other main surface side of the circuit substrate while keeping thermal contact with the heat sink with the base portion inserted into the opening to be in contact with the heat sink, so that the semiconductor module can be downsized.

According to the semiconductor module of the ninth aspect, the flat surface of the radiation fin is adjacent to the other main surface of the circuit substrate and faces the other main surface in parallel, so that the height of the semiconductor module, i.e., its size in the direction normal to the circuit substrate, can be minimized under the condition of constant heat radiation efficiency. That is to say, the semiconductor module can be made thinner.

According to the semiconductor module of the tenth aspect, since the peripheral edge of the flat surface of the radiation fin and the peripheral edge of the circuit substrate almost overlap each other, the heat radiating efficiency can be maximized on condition that the area of the semiconductor module, i.e., the size thereof in the direction along the main surface of the circuit substrate should be constant.

According to the semiconductor module of the eleventh aspect, since the, radiation fin is fixed to the semiconductor device, thermal contact between the radiation fin and the heat sink can be kept always good.

According to the semiconductor module of the twelfth aspect, since the radiation fin is coupled to the semiconductor device with a screw, the radiation fin can be attached to the semiconductor device easily.

It is an object of the present invention to provide a semiconductor device capable of easy mounting on a circuit substrate with other circuit elements and capable of miniaturization of the circuit substrate, and a semiconductor module formed of this semiconductor device mounted on the circuit substrate with other circuit elements.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

First, a semiconductor device of a first preferred embodiment will be described.

<1—1. Device Structure>

Figure 2:
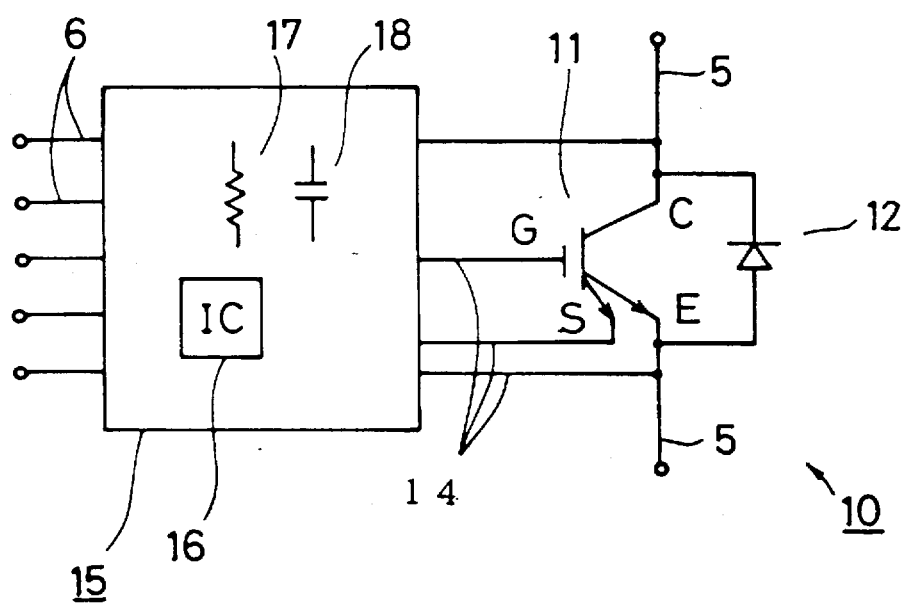
FIG. 2 is a circuit diagram of the semiconductor device of the first preferred embodiment.

FIG. 2 is a circuit diagram showing the circuit structure of a semiconductor device of this preferred embodiment. This device 101 includes a power circuit 10 having a power semiconductor element for modulation-controlling the flow of the main current charged with supply of power to loads and a controlling circuit 15 for controlling operation of this power semiconductor element.

The power circuit 10 includes an IGBT element 11 as a power semiconductor element and a free wheel diode 12. The IGBT element 11 conducts and cuts off (i.e., switches) the main current flowing from the collector electrode C to the emitter electrode E in response to the gate voltage signal inputted to the gate electrode G. This main current is supplied to an external load through the external terminals 5 connected to the collector electrode C and the emitter electrode E. The free wheel diode 12 connected to the IGBT element 11 in the inverse-parallel connection serves to prevent application of excessive reverse voltage to the IGBT element 11.

The control circuit 15 connected to the power circuit 10 through a plurality of interconnections 14 includes the controlling semiconductor element 16 as an integrated circuit element playing the main role in controlling the IGBT element 11, with a resistance element 17, a capacitance element 18, etc. These elements form a driving circuit and a protection circuit. The driving circuit is a circuit portion in the control circuit for transmitting the gate voltage signal to the gate electrode G in response to the control signal inputted to one of the plurality of external terminals 6. The protection circuit is a circuit portion for monitoring the operational environment of the IGBT element 11 to prevent damage to the IGBT element 11 when an abnormality occurs.

The protection circuit shown in FIG. 2 monitors the voltage between the collector electrode C and the emitter electrode E, i.e., the collector-emitter voltage and, when the voltage becomes too large above a certain reference value, it drives the gate electrode G to cut off the IGBT element 11 irrespective of the external control signal. The protection circuit also monitors the weak current flowing in the sense electrode S in proportion to the main current flowing in the IGBT element 11, i.e., the sense current, and when the main current becomes too large above a certain reference value, it drives the gate electrode G to cut off the IGBT element 11 irrespective of the external control signal.

Furthermore, when an excessive voltage or an excessive current occurs, the protection circuit of FIG. 2 transmits a signal indicating the occurrence of the abnormality to the outside through the external terminal 6. This way, the protection circuit serves to protect the IGBT element 11 from damage caused by an abnormality such as an excessive voltage or an excessive current, for example.

Figure 1:
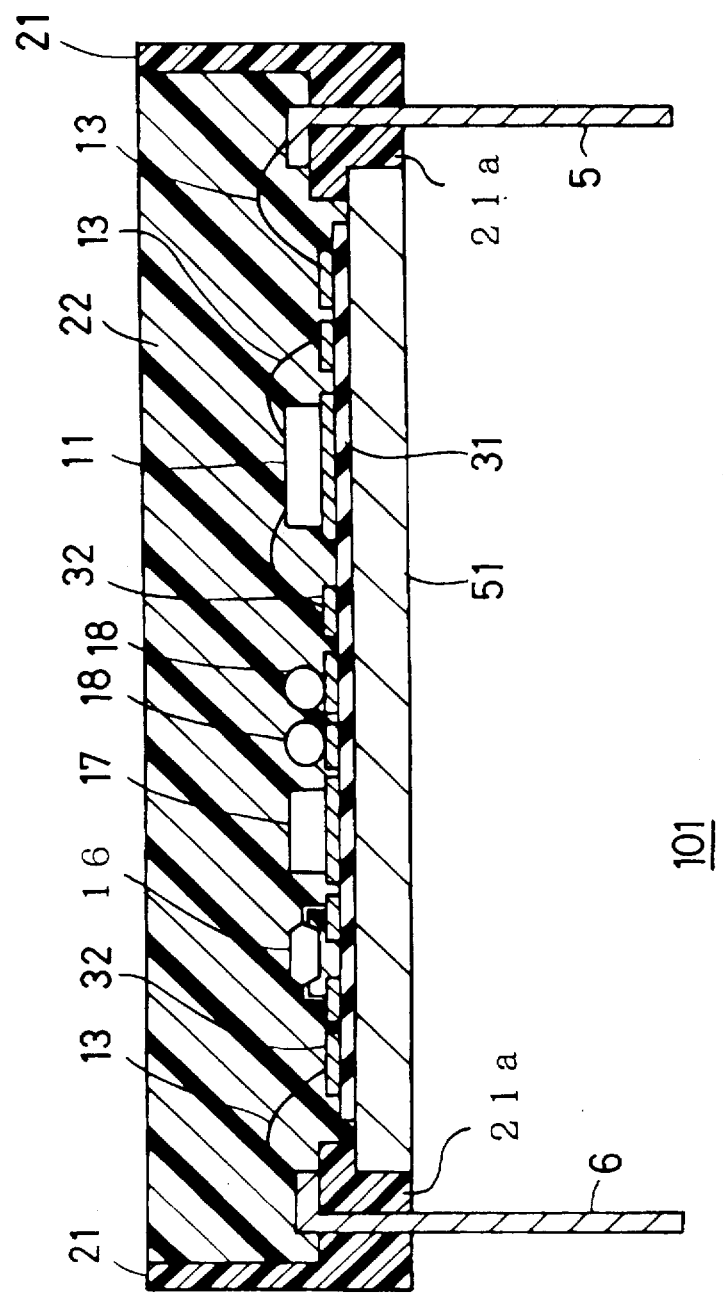
FIG. 1 is a front sectional view of a semiconductor device of a first preferred embodiment.
Figure 3:
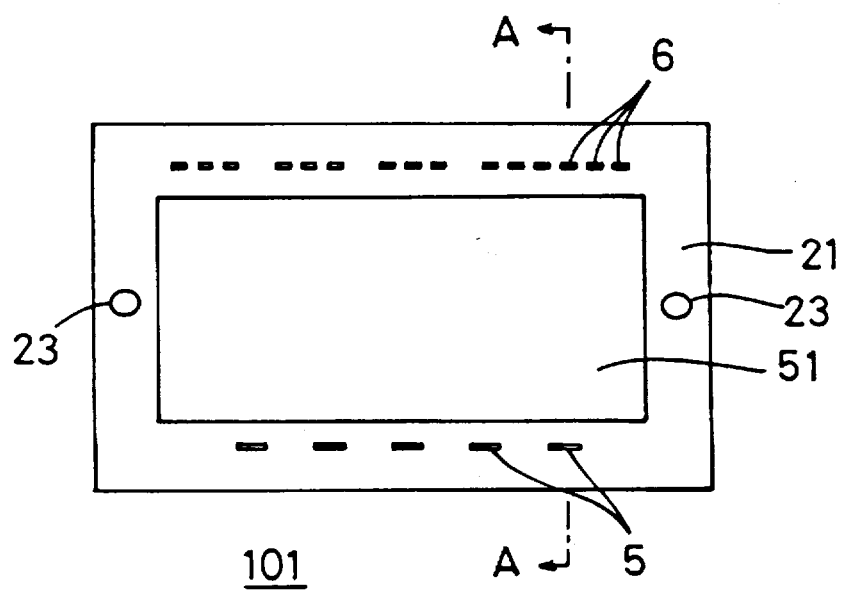
FIG. 3 is a bottom view of the semiconductor device of the first preferred embodiment.
Figure 4:
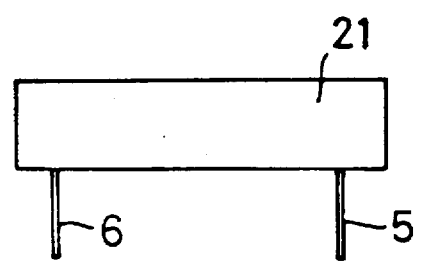
FIG. 4 is a front view of the semiconductor device of the first preferred embodiment.

FIG. 3 and FIG. 4 are respectively a bottom view and a front view of the device 101. FIG. 1 is a sectional view of the device 101 taken along the ling A—A shown in FIG. 3. As shown in these figures, in the device 101, the heat-resistant insulating substrate body 31 composed of a material of the epoxy resin system, for example, is affixed on the upper main surface of the sheet-like heat sink 51 substantially composed of a metal with good thermal conductivity, such as aluminum or copper, for example.

Furthermore, a highly electrically conductive conductor foil 32 substantially composed of copper, for example, and patterned into a certain configuration is provided on the upper main surface of this insulating substrate body 31. The interconnections 14 mentioned above are formed of this conductor foil 32. These members 51, 31 and 32 form an insulating metal substrate.

The IGBT element 11 is affixed with solder in the certain position on the conductor foil 32. Other portions of the conductor foil 32 and the IGBT element 11 are electrically connected through the aluminum bonding wire 13, for example. On the conductor foil 32, other elements such as the controlling semiconductor element 16, the resistance element 17, the capacitance elements 18, etc. are also affixed in predetermined positions, respectively. The IGBT element 11 as a power semiconductor element with heat generation is preferably formed as a bare chip element, as shown in FIG. 1.

The heat sink 51 is attached to the frame-like case 21 with an electric insulating property which opens in the upper surface and also selectively opens in the bottom. The heat sink 51 is fitted in the opening formed selectively in the bottom of the case 21 and is stopped at the projection formed selectively at the upper end of this opening and extending to the inside of the opening. The lower main surface of the heat sink 51, i.e., its main surface on the side opposite to the side where the insulating substrate body 31 is attached, is exposed to the outside of the device.

That is to say, it seems as if the case 21 and the heat sink 51 form the side and the bottom of a box opening on its top. The elements such as the IGBT element 11 are accommodated inside of this box, i.e, in the accommodation room surrounded by the heat sink 51 and the case 21.

The opening which the heat sink 51 is put in is selectively formed, leaving the peripheral portion 21a, in the bottom of the case 21. The external terminals 5 and 6 are attached to this peripheral portion 21a adjacent to the periphery of the heat sink 51. These external terminals 5 and 6 pass through the peripheral portion 21a so that one end of each is in the accommodation room and the other protrudes to the outside. Furthermore, the other ends of the external terminals 5 and 6 project in the direction in which the exposed surface, or the lower main surface, of the heat sink 51 is directed.

The one end of each of the external terminals 5 and 6 in the accommodation room is electrically connected to a predetermined position of the conductor foil 32 through the bonding wire 13. The accommodation room is filled with sealing resin 22 with an electric insulating property to protect the various elements such as the IGBT element 11 and the bonding wire 13, etc. It is preferred that the case 21 be formed of a resin suitable for sealing the external terminals 5 and 6.

In the usual usage of the device 101, an external radiation fin (not shown) is connected to the device 101 to keep thermal contact with the exposed surface, or the lower main surface, of the heat sink 51. This allows the loss heat generated in the IGBT element 11 to be efficiently radiated to the outside through the heat sink 51. The case 21 has a pair of through holes 23 (FIG. 3) to enable easy connection of the radiation fin with screws.

<1-2. Usage of Device>

Figure 5:
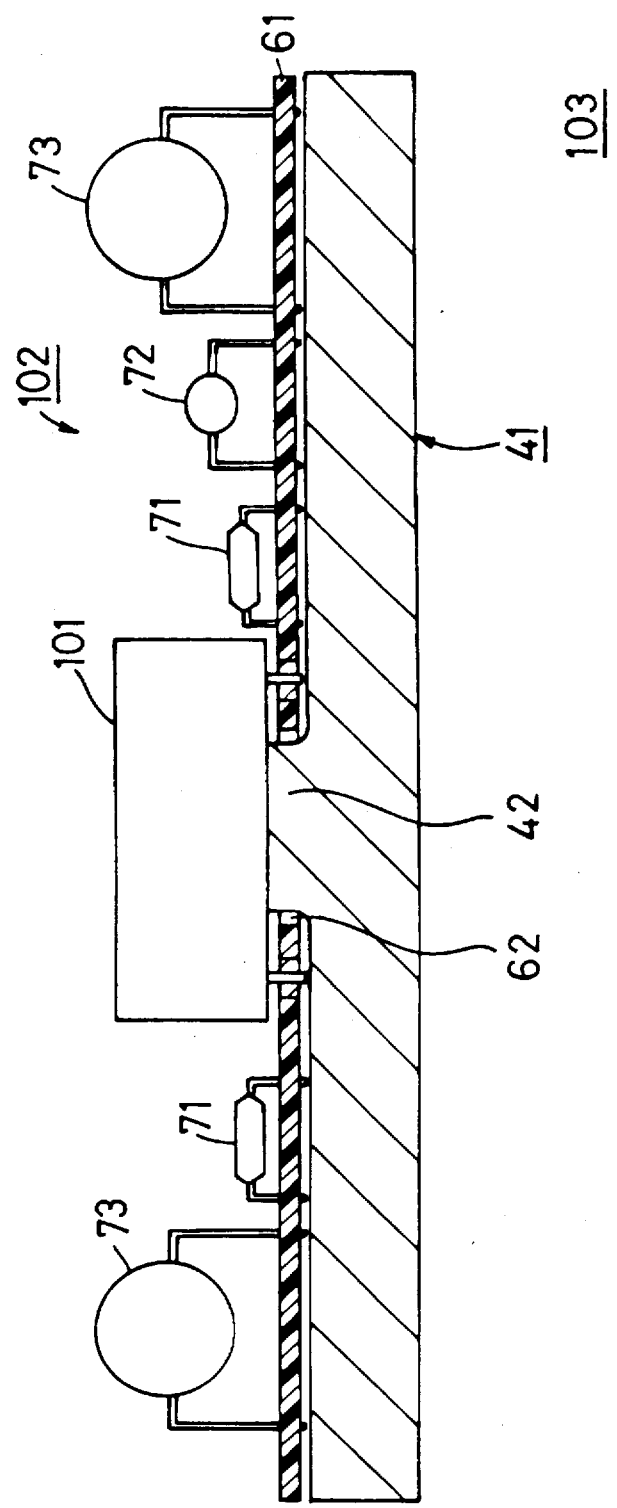
FIG. 5 is a front sectional view of a semiconductor module of the first preferred embodiment.

FIG. 5 is a front sectional view showing the usage of the device 101. In this usage, various circuit elements 71, 72, 73, together with the device 101, are provided on the circuit substrate 61 having certain interconnection pattern (not shown). For example, these circuit elements 71, 72, 73 are an integrated circuit element, a resistance element and a capacitance element, respectively. The device 101, together with the respective circuit elements 71, 72 and 73, is provided on one main surface (the upper main surface) side of the circuit substrate 61. Provided on the other main surface (lower main surface) side of the circuit substrate 61 is the thermally well conducting radiation fin 41 substantially composed of aluminum, for example.

Figure 6:
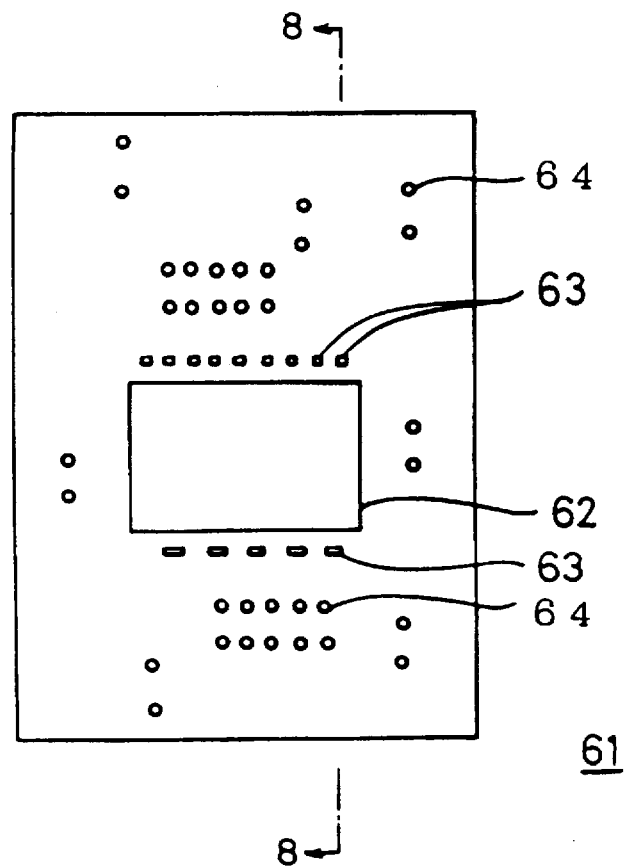
FIG. 6 is a plan view of the circuit substrate of the first preferred embodiment.

FIG. 6 is a plan view of the circuit substrate 61. As shown in FIG. 6, through holes 63 and 64 are provided in a lot of positions in the main surface of the circuit substrate 61. The external terminals 5 and 6 of the device 101 and the pins of the circuit elements 71, 72 and 73 are inserted into the through holes 63 and 64 and soldered there in order to attach the device 101 and the circuit elements 71, 72 and 73 to the circuit substrate 61.

An opening 62 is also formed in the main surface of the circuit substrate 61. The through holes 63 for attaching the device 101 are arranged around this opening 62. Accordingly, when the device 101 is fixed to the through holes 63, the heat sink 51 is exposed to the other main surface (lower main surface) of the circuit substrate 61 through the opening 62.

Figure 7:
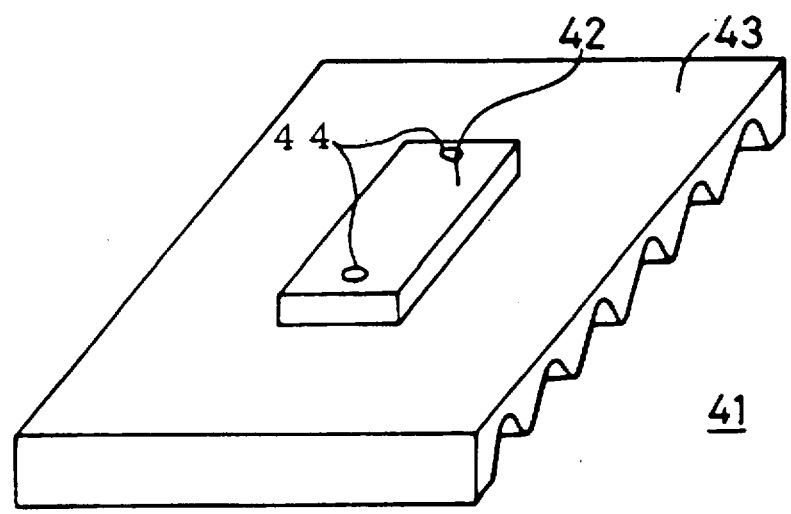
FIG. 7 is a perspective view of the radiation fin of the first preferred embodiment.

FIG. 7 is an entire perspective view of the radiation fin 41. As shown in FIG. 7, the radiation fin 41 has a projecting base portion 42 in a part of the flat surface 43. The head of the base portion 42 is flat similarly to the flat surface 43. A pair of screw holes 44 are formed in the head of the base portion 42.

Referring FIG. 5 again, the base portion 42 passes through the opening 62 of the circuit substrate 61 so that surface contact is realized between the exposed surface of the heat sink 51 of the device 101 and the flat head of the base 42. The radiation fin 41 can easily be coupled tight to the device 101 by fitting the screws into the tapped holes 44 through the through holes 23 provided in the device 101. That is to say, in this example, the radiation fin 41 is fixedly coupled to the circuit substrate 61 through the device 101.

The application device including the circuit substrate 61 and the device 101 and other circuit elements 71, 72 and 73 mounted thereon has a certain function, which can be produced as a semiconductor module 102. The application device formed of the semiconductor module 102 and the radiation fin 41 attached thereto can also be produced as a more useful semiconductor module 103.

<1-3. Advantages of Device and Module>

As has been described above, since the external terminals 5 and 6 protrude in the direction in which the exposed surface of the heat sink 51 is directed in the device 101, the device 101 can be mounted on the upper main surface of the circuit substrate 61, which is on the side opposite to the side where the radiation fin 41 is mounted, together with other circuit elements 71, 72, 73 etc. Accordingly, application of solder to the through holes 63 and 64, and soldering of the device 101 and the various circuit elements 71, 72 and 73, required to mount the device 101 and the various circuit elements 71, 72 and 73, can be collectively achieved.

That is to say, the device 101 and the circuit elements 71, 72 and 73 can be efficiently mounted to the circuit substrate 61. In other words, the manufacturing process of the semiconductor modules 102 and 103, which are application devices of the device 101, is easy. Furthermore, since the radiation fin 41 is provided on the side opposite to the device 101 and the various circuit elements 71, 72, 73, etc. with the circuit substrate 61 therebetween, it is possible to downsize the semiconductor module 103 while keeping the area of the circuit substrate 61 small.

Moreover, the device 101, in which the external terminals 5 and 6 are fixed to the case 21, does not require the process of soldering the external terminals 5 and 6 to the conductor foil 32, unlike the conventional device 151. Also, as has been already stated, the case 21 is preferably formed of a resin suitable for sealing. In this case, the external terminals 5 and 6 can easily be fixed to the case 21 by sealing them with the resin when injecting the resin into the mold and forming it into the case 21.

In this process, especially, as compared with the process of soldering the external terminals 5 and 6 to the conductor foil 32, which the conventional device requires, it is far easier to precisely fix the external terminals 5 and 6 in predetermined positions. Good contact between the external terminals 5 and 6, and the case 21 can also be obtained. That is to say, the manufacturing process of the device 101 itself can be simplified as compared with the conventional device 151.

The device 101, in which the external terminals 5 and 6 are not soldered to the conductor foil 32 but fixed to the case 21, solves the problem in the conventional device that thermal transformation due to the difference in coefficient of thermal expansion between the insulating substrate body 31 and the heat sink 51 causes stresses to concentrate upon the connection between the external terminals 5, 6 and the conductor foil 32. Particularly, since the external terminals 5 and 6 are attached to pass through the peripheral portion 21a forming a part of the bottom of the case 21, the external terminals 5 and 6 can be formed into almost linear shape, as exemplified in FIG. 1. That is to say, it also provides the advantage that the shape of the external terminals 5 and 6 can be simplified.

Furthermore, since electric connection between the external terminals 5, 6 and the conductor foil 32 is made not by soldering but through the bonding wire 13, the process of electrically connecting the external terminals 5, 6 and the conductor foil 32 is simplified. Especially, as shown in FIG. 1, it is preferred that the external terminals 5 and 6 are attached to the case 21 in such a way that the portions of the external terminals 5, 6 connected to the bonding wire 13 are located on the almost same plane as the surface of the conductor foil 32.

At this time, bonding between the external terminals 5, 6 and the conductor foil 32 with the bonding wire 13 can be accomplished more easily. Also, the bonding between the external terminals 5, 6 and the conductor foil 32 can be simultaneously performed in the process of bonding the elements such as the IGBT element 11 etc. and the conductor foil 32 with the bonding wire 13. That is to say, the manufacturing process of the device 101 is further simplified.

In the semiconductor module 103 shown in FIG. 5, since the flat surface 43 is adjacent to the other main surface of the circuit substrate 61 and faces it in parallel, the advantage can also be obtained that the height of the semiconductor module 103, i.e., its size in the direction normal to the main surface of the circuit substrate 61, can be minimized under the condition of constant heat radiating efficiency.

Furthermore, in the semiconductor module 103, the flat surface 43 is maximized in area in the range where the radiation fin 41 does not protrude from the peripheral edge of the circuit substrate 61. That is to say, the peripheral edge of the flat surface 43 and the peripheral edge of the circuit substrate 61 almost overlap each other. Accordingly, on condition that the area of the semiconductor module 103, i.e., its size in the direction along the main surface of the circuit substrate 61, should be constant, heat radiation efficiency can be maximized.

As shown in FIG. 6, the opening 62 is preferably formed in the vicinity of the center of the main surface of the circuit substrate 61. This enables the maximum heat radiating efficiency by using the radiation fin 41 as large as the circuit substrate 61.

<2. Second Preferred Embodiment>

Figure 8:
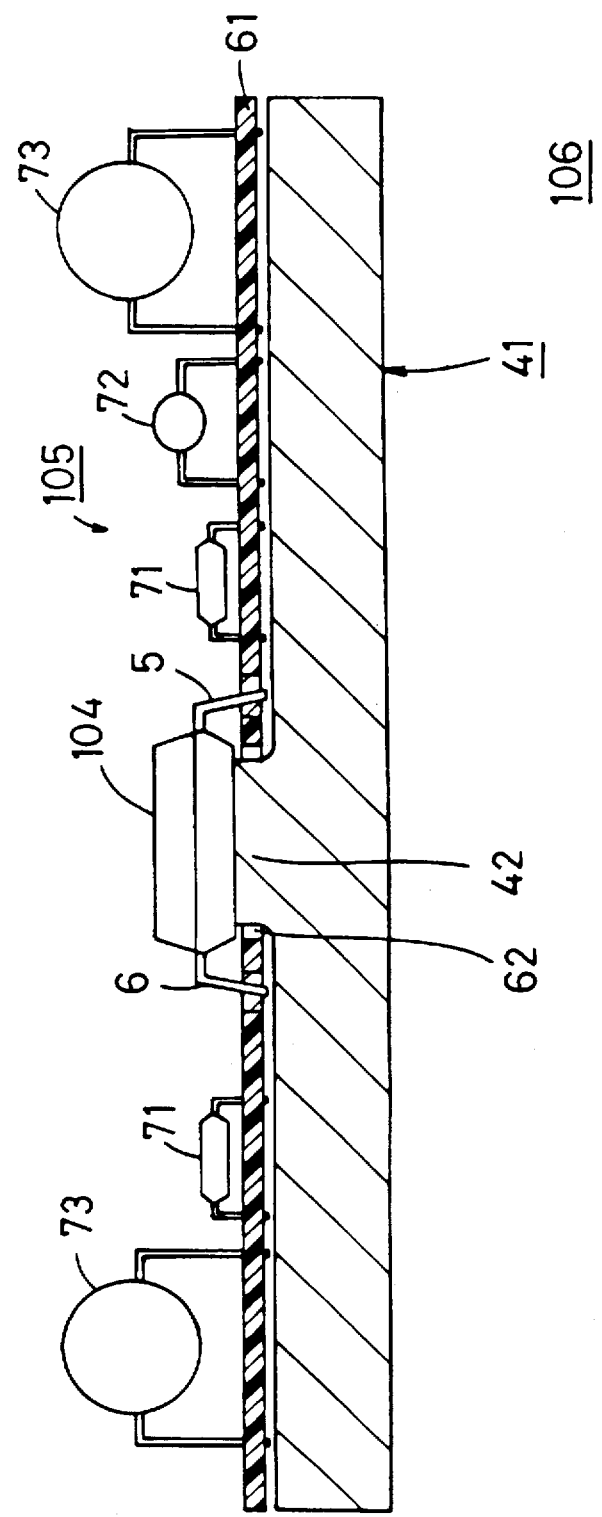
FIG. 8 is a front sectional view of a semiconductor module of a second preferred embodiment.

FIG. 8 is a front sectional view showing the structure of a semiconductor module of a second preferred embodiment. In the semiconductor module 105 and the semiconductor module 106 formed by attaching the radiation fin 41 thereto have the structure in which the device 101 is replaced by the semiconductor device 104 of resin mold type, in the first preferred embodiment.

Figure 9:
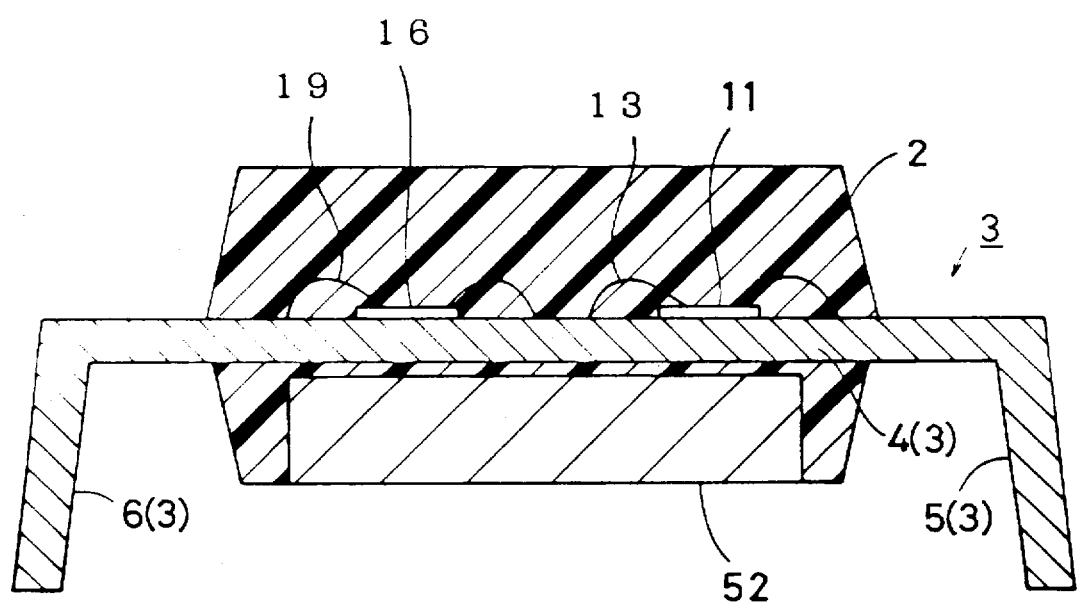
FIG. 9 is a front sectional view of the semiconductor device of the second preferred embodiment.

FIG. 9 is a front sectional view of the device 104. As shown in FIG. 9, in the device 104, various elements included in the control circuit 15 and the power circuit 10 are soldered in a plurality of positions on the sheet-like lead frame 3 substantially formed of a metal with good electric conductivity such as copper. FIG. 9 shows the IGBT element 11 and the controlling semiconductor element 16 as representatives of these elements. These elements are preferably formed as bare chip elements as shown in FIG. 9.

The IGBT element 11 and other portions of the lead frame 3 are electrically connected through the aluminum bonding wires 13, for example. Similarly, the controlling semiconductor element 16 and still other portions of the lead frame 3 are electrically connected by the gold bonding wires 19, for example. The lead frame 3 having certain pattern configuration forms the interconnection pattern 4 of the control circuit 15 and the power circuit 10 including the interconnections 14 and also forms the external terminals 6 and the external terminals 5.

The plate-like heat sink 52 substantially composed of well heat conducting metal such as aluminum or copper, for example, is provided to face the lower main surface of the lead frame 3 on the opposite side to the top main surface on which the various elements are mounted (the element mounting surface). The sealing resin 2 with an electric insulating property and good thermal conductivity seals in the part of the lead frame 3 corresponding to the interconnection pattern 4, the various elements mounted on the interconnection pattern 4 and the heat sink 51.

A small gap is provided between the lead frame 3 and the heat sink 52, which is filled with the sealing resin 2. The sealing resin 2 put in the gap serves to electrically insulate the lead frame 3 and the heat sink 52 and also to well transmit the loss heat generated in the IGBT element 11 from the lead frame 3 to the heat sink 52. The sealing resin 2 also functions to fixedly couple the lead frame 3 and the heat sink 52 and to protect the interconnection pattern 4 and the various elements thereon from the external moisture and the like.

Figure 10:
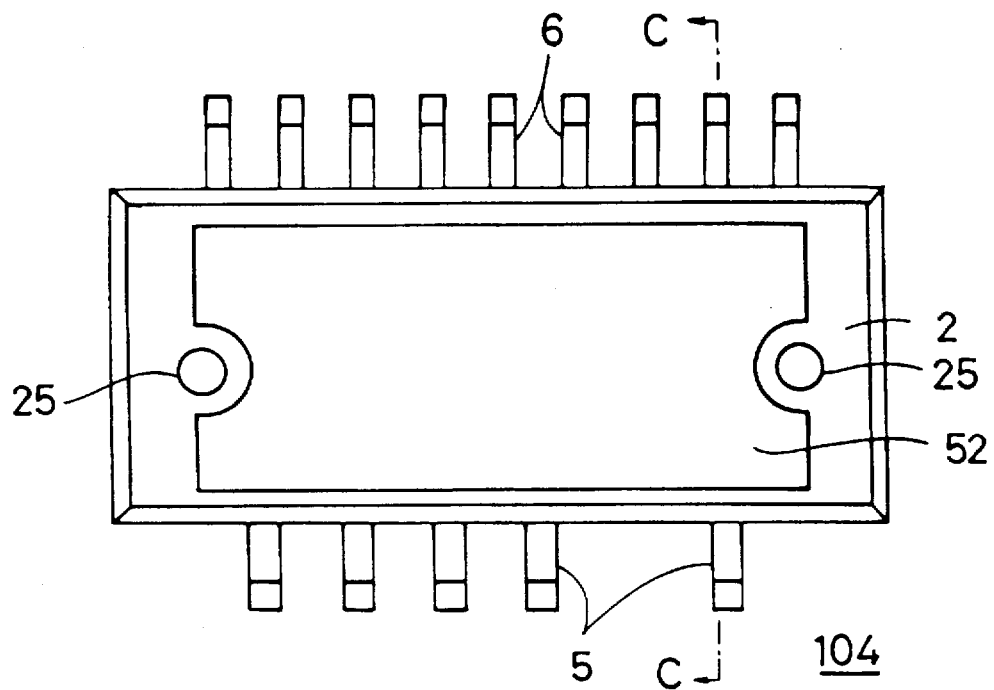
FIG. 10 is a bottom view of the semiconductor device of the second preferred embodiment.

FIG. 10 is a bottom view of the device 104. FIG. 9 described above corresponds to the section taken along the line C—C in FIG. 10. As shown in FIG. 10, the external terminals 5 and the external terminals 6 protrude to the outside from the side walls of the sealing resin 2 and the lower main surface of the heat sink 52, or its main surface on the side opposite to the upper main surface facing the lead frame 3, is exposed in the bottom.

Figure 11:
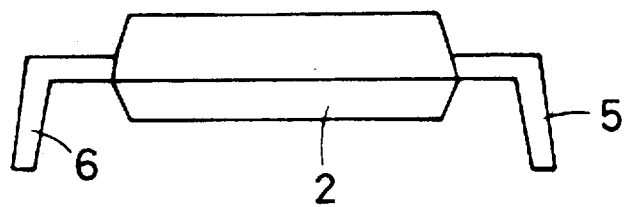
FIG. 11 is a front view of the semiconductor device of the second preferred embodiment.
Figure 12:
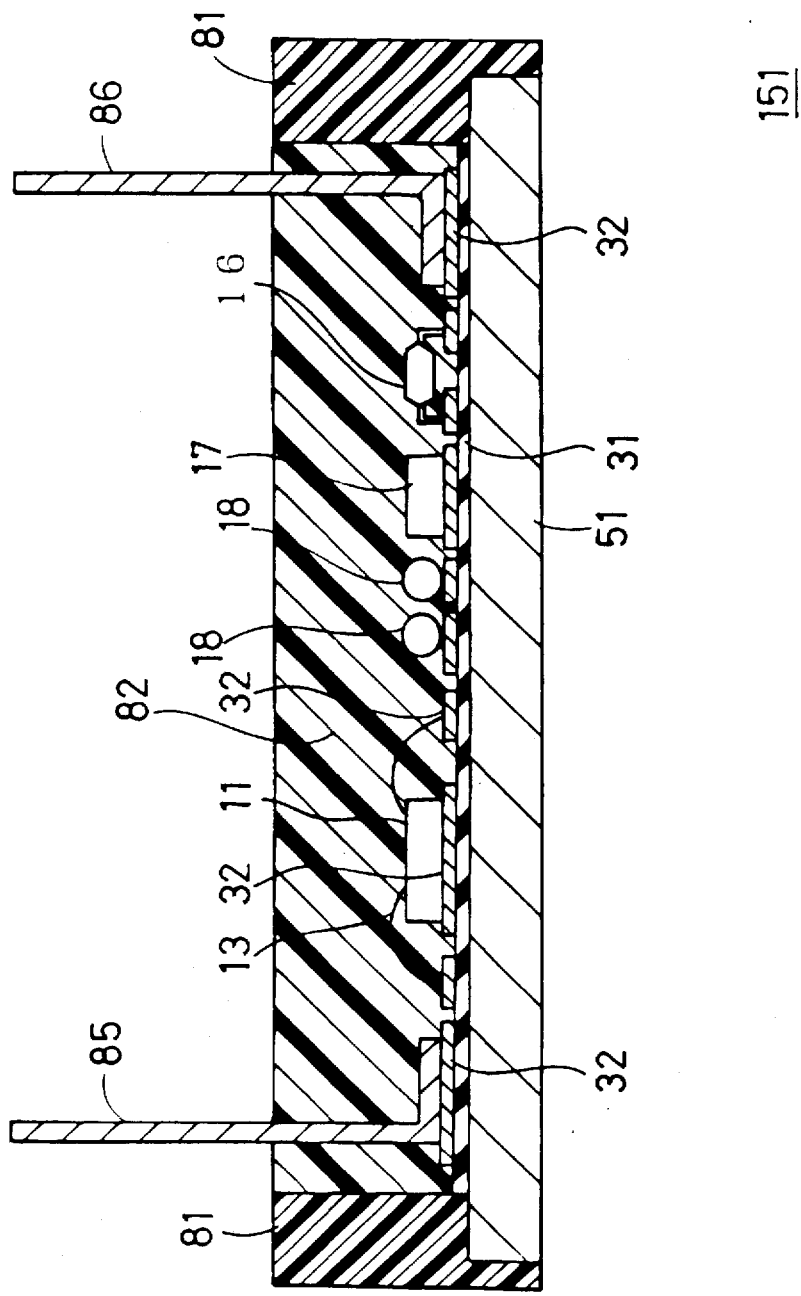
FIG. 12 is a front sectional view of a conventional semiconductor device.
Figure 13:
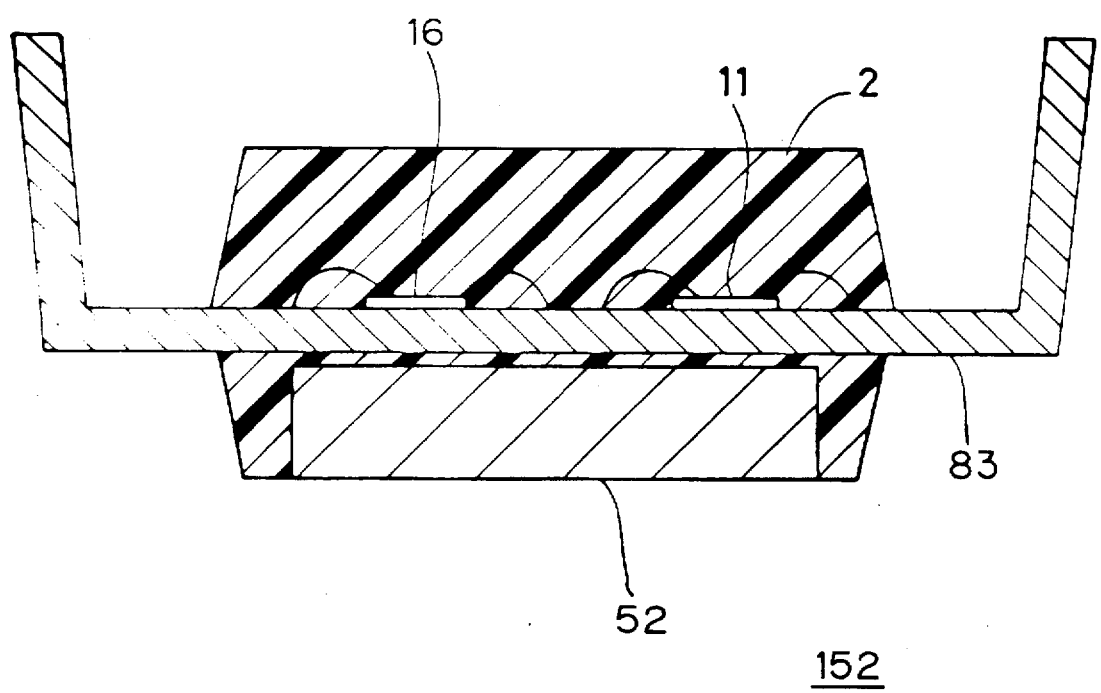
FIG. 13 is a front sectional view of another conventional semiconductor device.
Figure 14:
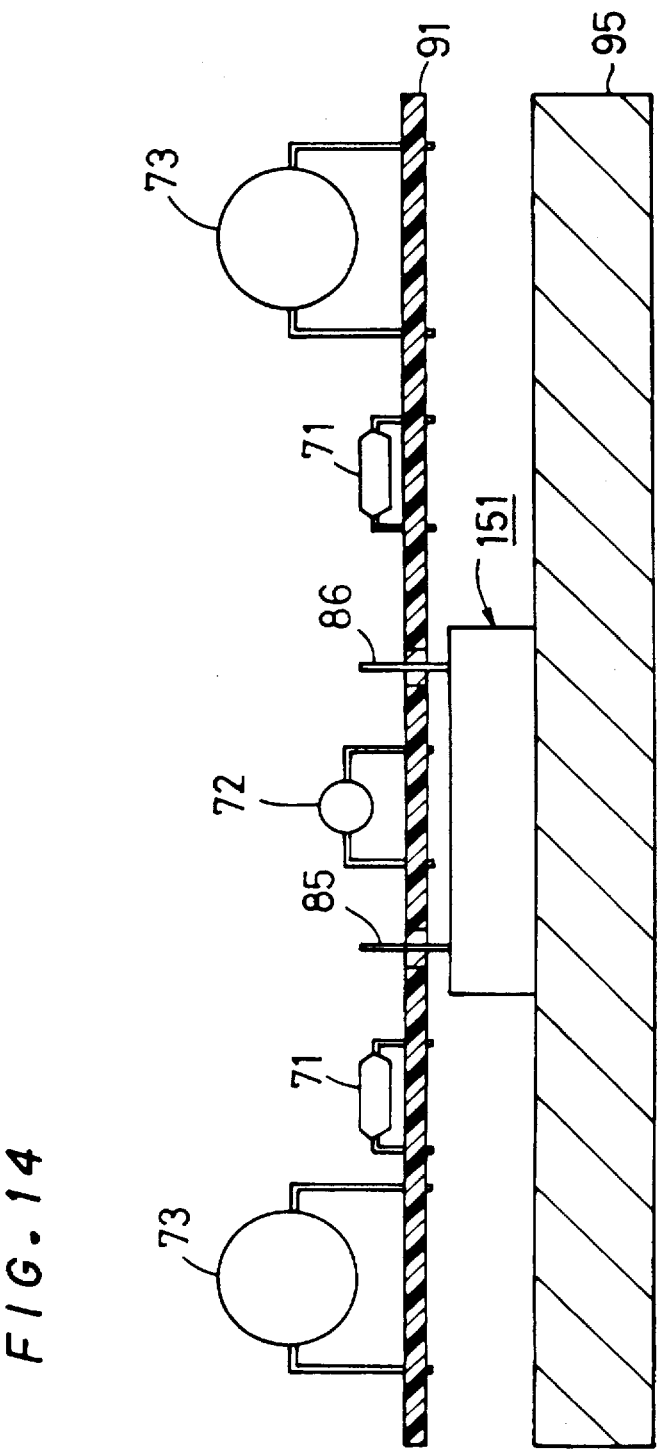
FIG. 14 is a front sectional view showing the usage of the conventional semiconductor device.
Figure 15:
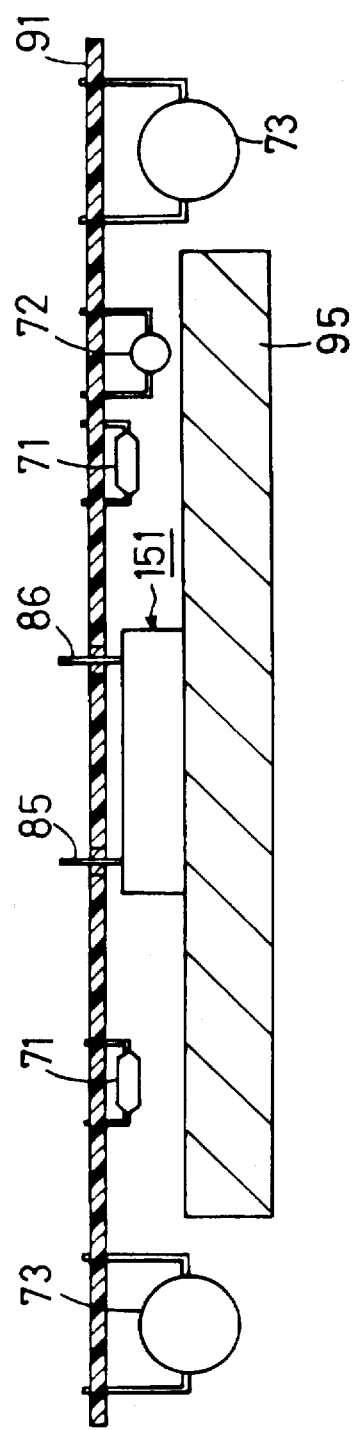
FIG. 15 is a front sectional view showing another usage of the conventional semiconductor device.

FIG. 11 is a front view of the device 104. As shown in FIG. 11 and FIG. 9 described above, the external terminals 5 and 6 are both bent so that their ends protrude in the direction in which the lower main surface of the heat sink 52, i.e., its exposed surface, is directed. That is to say, in the device 104, similarly to the device 101, the ends of the external terminals 5 and 6 protrude in the direction in which the exposed surface of the heat sink 52 is directed.

Accordingly, referring to FIG. 8 again, the device 104 can be mounted together with other circuit elements 71, 72, 73 etc. on the upper main surface of the circuit substrate 61, which is its main surface on the side opposite to the side on which the radiation fin 41 is mounted. Hence, similarly to the first preferred embodiment, the application of solder to the through holes 63 and 64 (FIG. 6), and soldering of the device and the circuit elements, required to attach the device and circuit elements, can be collectively accomplished.

The radiation fin 41 is provided on the side opposite to the device 104 and the various circuit elements 71, 72, 73 etc. with the circuit substrate 61 interposed therebetween. Then the flat head of the base portion 42 and the exposed surface of the heat sink 52 come in surface contact with each other through the opening 62 to keep thermal contact between the heat sink 52 and the radiation fin 41.

Accordingly, the size of the semiconductor module 106 can be reduced while keeping the area of the circuit substrate 61 small.

<3. Modified Examples>

Although the preferred examples in which the control circuit 15 forms a driving circuit and a protection circuit have been shown in the above-described preferred embodiments, the elements included in the control circuit 15, such as the controlling semiconductor element 16, may generally form only the driving circuit. In this case, the IGBT element 11 does not require the sense electrode S in the circuit diagram of FIG. 2. In the plurality of interconnections 14, the interconnection coupling the collector electrode C and the sense electrode S, and the control circuit 15 is not required. Furthermore, part of the external terminals 6 is not required.

Furthermore, generally, this invention can also be applied to a semiconductor device having only the power circuit 10 and no controlling circuit 15. Also, it is also applicable to a semiconductor device having only the power semiconductor element, such as the IGBT element 11, as circuit elements.

While the invention has been described in detail, the foregoing description is in all aspects illustrative and not restrictive. It is understood that numerous other modifications and variations can be devised without departing from the scope of the invention.

We claim:

1. A semiconductor device, comprising:

a thermally conductive heat sink having an upper heat sink surface and an oppositely directed lower heat sink surface;

an insulating substrate having a lower substrate surface mounted on said upper heat sink surface and an oppositely directed upper substrate surface;

a patterned electrically conductive foil mounted on the upper substrate surface;

a power semiconductor element mounted on said patterned electrically conductive foil;

an electrically insulating case surrounding at least said insulating substrate, said patterned electrically conductive foil, and said power semiconductor element and having an opening in a bottom portion of the case, said heat sink fitted in and filling said opening with the lower heat sink surface being exposed to an atmosphere outside said case; and at least one electrically conductive external terminal having one end electrically connected to said patterned electrically conductive foil surrounded by the case and a second end protruding from the case in a direction in which said lower heat sink surface faces.

2. The semiconductor device according to claim 1, wherein said opening is provided in the bottom portion of the case with at least one peripheral portion of the bottom portion of said case remaining after the opening is provided, and said at least one electrically conductive external terminal passes through said peripheral portion.

3. The semiconductor device according to claim 2, wherein said one end of said at least one electrically conductive external terminal is electrically connected to said patterned electrically conductive foil through an electrically conductive bonding wire.

4. The semiconductor device according to claim 3, wherein said at least one electrically conductive external terminal includes a connecting portion at said one end which is connected to said bonding wire said connecting portion and said patterned electrically conductive foil being located almost in a same plane.

5. The semiconductor device according to claim 4, wherein said case is formed of a resin sealing around said at least one electrically conductive external terminal passing through said peripheral portion of said case.

6. The semiconductor device according to claim 5, further comprising a controlling semiconductor element mounted on said patterned electrically conductive foil for controlling said power semiconductor element.

7. The semiconductor device according to claim 6, wherein the inside of said case is filled with another resin.

8. The semiconductor device according to claim 7, wherein said power semiconductor element is an IGBT.

9. The semiconductor device according to claim 8, further comprising a free wheel diode mounted on said patterned electrically conductive foil and connected to said IGBT.

10. The semiconductor device according to claim 9, wherein said heat sink comprises aluminum.

11. The semiconductor device according to claim 10, wherein said at least one electrically conductive external terminal comprises copper.

12. A semiconductor module, comprising:

a semiconductor device having an exterior casing enclosing a power semiconductor element, said semiconductor device having a heat sink with an exposed surface forming at least a part of a bottom segment of the exterior casing and at least one external terminal having an end protruding from a portion of the exterior casing separated from the exposed surface of the heat sink, said protruding end extending in a direction in which said exposed surface of the heat sink faces;

a circuit element having a housing with at least one pin extending from a housing surface; and a circuit substrate having an upper surface and an oppositely directed lower surface;

wherein said protruding end of said at least one external terminal and said pin engage with elements on the upper surface of said circuit substrate so that said semiconductor device and said circuit element are mounted above the upper surface of said circuit substrate; and said circuit substrate further includes an opening extending from the upper substrate surface to the oppositely directed lower substrate surface and in a position under said exposed surface of said heat sink of the semiconductor device mounted above the upper surface of the circuit substrate.

13. The semiconductor module according to claim 12, further comprising a thermally conductive radiation fin having a flat surface with a base portion having a projection with a flat head, wherein said thermally conductive radiation fin is provided adjacent to the oppositely directed lower surface of said circuit substrate and said base portion extends through said opening with said flat head in surface contact with said exposed surface of said heat sink.

14. The semiconductor module according to claim 13, wherein said flat surface is adjacent to and faces said oppositely directed lower surface of said circuit substrate.

15. The semiconductor module according to claim 14, wherein a periphery of said flat surface and a periphery of said circuit substrate almost overlap each other.

16. The semiconductor module according to claim 15, wherein said thermally conductive radiation fin is fixed to said semiconductor device.

17. The semiconductor module according to claim 16, wherein said thermally conductive radiation fin is coupled to said semiconductor device with a screw.

18. The semiconductor module according to claim 17, wherein said thermally conductive radiation fin comprises aluminum.

19. The semiconductor module according to claim 18, wherein said thermally conductive radiation fin has a tapped hole which engages with said screw, and said semiconductor device has a through hole through which said screw passes.

20. The semiconductor module according to claim 19, wherein said opening is formed almost in the center of said circuit substrate.

* * * * *